United States Patent
Chou et al.

(10) Patent No.: US 9,514,042 B2
(45) Date of Patent: Dec. 6, 2016

(54) METHOD FOR MANAGING MEMORY APPARATUS TO PERFORM WRITING CONTROL ACCORDING TO MONITORED DATA AMOUNT OF RECEIVED DATA, ASSOCIATED MEMORY APPARATUS THEREOF AND ASSOCIATED CONTROLLER THEREOF

(71) Applicant: Silicon Motion Inc., Hsinchu County (TW)

(72) Inventors: Po-Sheng Chou, Miaoli County (TW); Yu-Wei Fan, Taoyuan County (TW); Chung-Yuan Chan, Taichung (TW)

(73) Assignee: Silicon Motion Inc., Hsinchu County (TW)

( * ) Notice: Subject to any disclaimer, the term of this patent is extended or adjusted under 35 U.S.C. 154(b) by 171 days.

(21) Appl. No.: 14/334,684

(22) Filed: Jul. 18, 2014

(65) Prior Publication Data

US 2015/0039810 A1    Feb. 5, 2015

Related U.S. Application Data

(60) Provisional application No. 61/862,094, filed on Aug. 5, 2013.

(30) Foreign Application Priority Data

Dec. 6, 2013    (TW) .............................. 102144913 A

(51) Int. Cl.
*G06F 11/00* (2006.01)
*G06F 12/02* (2006.01)
(Continued)

(52) U.S. Cl.
CPC ....... *G06F 12/0246* (2013.01); *G06F 12/0868* (2013.01); *G06F 2212/7201* (2013.01); *G11C 7/10* (2013.01); *G11C 2211/5641* (2013.01)

(58) Field of Classification Search
USPC ......................................................... 711/103
See application file for complete search history.

(56) References Cited

U.S. PATENT DOCUMENTS 7,962,685 B2    6/2011    Cheung et al.
8,040,744 B2    10/2011   Gorobets
(Continued)

FOREIGN PATENT DOCUMENTS

JP    2010250846 A    11/2010
KR   1020080091203 A   10/2008
(Continued)

*Primary Examiner* — Mardochee Chery
(74) *Attorney, Agent, or Firm* — Winston Hsu; Scott Margo

(57) ABSTRACT

A method for managing a memory apparatus and the associated memory apparatus thereof and the associated controller thereof are provided, where the method includes: temporarily storing data received from a host device into a volatile memory in the controller and utilizing the data in the volatile memory as received data, and dynamically monitoring the data amount of the received data to determine whether to immediately write the received data into at least one non-volatile memory element; and when determining to immediately write the received data into the at least one non-volatile memory element, directly writing the received data into a specific block configured to be a Multiple Level Cell memory block within a specific non-volatile memory element, rather than indirectly writing the received data into the specific block by first temporarily writing the received data into any other block configured to be Single Level Cell memory block.

20 Claims, 7 Drawing Sheets

(51) Int. Cl.
   *G06F 12/08* (2016.01)
   *G11C 7/10* (2006.01)

(56) References Cited

U.S. PATENT DOCUMENTS

| | | |
|---|---|---|
| 9,134,924 B2 | 9/2015 | Yano et al. |
| 2009/0300269 A1* | 12/2009 | Radke et al. ............... 711/103 |
| 2010/0023682 A1 | 1/2010 | Lee |
| 2010/0042773 A1 | 2/2010 | Yeh |
| 2010/0115192 A1 | 5/2010 | Lee |
| 2010/0174847 A1 | 7/2010 | Paley |
| 2011/0041005 A1 | 2/2011 | Selinger |
| 2012/0246391 A1 | 9/2012 | Meir |
| 2012/0254574 A1 | 10/2012 | Sinclair |
| 2012/0311245 A1 | 12/2012 | Yano |
| 2013/0173844 A1 | 7/2013 | Chen |

FOREIGN PATENT DOCUMENTS

| | | |
|---|---|---|
| KR | 1020130010447 A | 1/2013 |
| TW | 201030521 | 8/2010 |
| TW | 201035757 | 10/2010 |

\* cited by examiner

US 9,514,042 B2

METHOD FOR MANAGING MEMORY APPARATUS TO PERFORM WRITING CONTROL ACCORDING TO MONITORED DATA AMOUNT OF RECEIVED DATA, ASSOCIATED MEMORY APPARATUS THEREOF AND ASSOCIATED CONTROLLER THEREOF

CROSS REFERENCE TO RELATED APPLICATIONS

This application claims the benefit of U.S. provisional application No. 61/862,094 filed on Aug. 5, 2013 and incorporated herein by reference.

BACKGROUND OF THE INVENTION

1. Field of the Invention

The present invention relates to the control of the flash memory, and more particularly, to a method for managing a memory apparatus, and the associated memory apparatus and controller thereof.

2. Description of the Prior Art

Due to the development of the flash memory techniques, various portable memory apparatuses (e.g., memory cards which meet the SD/MMC, CF, MS and XD specifications) are widely implemented for various applications. Hence, the access control of the flash memories in these portable memory apparatuses has become an important issue.

For example, commonly used NAND flash memories can be categorized into two types, the single level cell (SLC) flash memories and the multiple level cell (MLC) flash memories. Each transistor used as a memory cell in the SLC flash memory has only two charge values which are represented in logic values 0 and 1. Further, the storage capacity of each transistor used as a memory cell in the MLC flash memory is fully utilized, and the transistor of the MLC flash memory is driven by a higher voltage, to record multiple bits information (e.g., 00, 01, 11 and 10) in one transistor through various levels of voltages. Theoretically, the recording density of the MLC flash memory may exceed two times the recording density of the SLC flash memory. This is good news to related industries having difficulties in developing NAND flash memories.

Compared with the SLC flash memory, the cost of manufacturing the MLC flash memory is cheaper, and the MLC flash memory is capable of providing a larger capacity in a limited space. Hence, the MLC flash memory is widely applied to various portable memory apparatuses in the market. According to a related art technique, since the operations of some types of MLC flash memories are complicated, a traditional memory controller configures a portion of physical blocks in an MLC flash memory to serve as SLC memory blocks, for receiving the write data from a host device. However, some problems are thereby generated. For example, since a portion of physical blocks in the MLC flash memory is configured as SLC memory blocks, the amount of physical blocks of the MLC flash memory which can be used as MLC memory blocks are fewer. For another example, the traditional memory controller temporarily writes the received data into SLC memory blocks first, and then collects data to the MLC memory blocks from the SLC memory blocks, wherein the storage space of these SLC memory blocks may easily run out. Hence, the work load of the memory controller is greatly increased. Therefore, there is a need for a novel method for enhancing the control of the data access of the flash memory, to raise the overall performance without introducing side effects (e.g., errors of stored data).

SUMMARY OF THE INVENTION

Hence, an objective of the present invention is to provide a method for managing a memory apparatus and the associated memory apparatus and controller, to solve aforementioned problems.

Another object of the present invention is to provide a method for managing a memory apparatus and the associated memory apparatus and controller, to raise the operation performance of the memory apparatus.

According to at least one preferred embodiment of the present invention, a method for managing a memory apparatus is provided. The memory apparatus includes at least one non-volatile (NV) memory element, and each nonvolatile memory element includes a plurality of blocks. The method is applied to a controller of the memory apparatus, and the controller is used to control the at least one NV element. The method includes the following steps: temporarily storing data received from a host device into a volatile memory in the controller and utilizing the data in the volatile memory as received data, and dynamically monitoring the data amount of the received data to determine whether to immediately write the received data into the at least one NV memory element, wherein at least one write command received from the host device indicates that the host device requests to write the data; and when determining to immediately write the received data into the at least one NV memory element, directly writing the received data into a specific block configured to be a Multiple Level Cell (MLC) memory block within a specific NV memory element of the at least one NV memory element, rather than indirectly writing the received data into the specific block by first temporarily writing the received data into any other block configured to be Single Level Cell (SLC) memory block.

Besides providing the above method, the present invention also provides a memory apparatus including at least one non-volatile (NV) memory element and a controller. Each of the at least one NV memory element includes a plurality of blocks. The controller is used for controlling the at least one NV element. The controller includes a processing unit, arranged for managing the memory apparatus according to a program code embedded in the processing unit or received from outside of the processing unit. The controller temporarily stores data received from a host device into a volatile memory in the controller and utilizing the data in the volatile memory as received data, and dynamically monitors the data amount of the received data to determine whether to immediately write the received data into the at least one NV memory element, wherein at least one write command received from the host device indicates that the host device requests to write the data. When determining to immediately write the received data into the at least one NV memory element, the controller directly writes the received data into a specific block configured to be a Multiple Level Cell (MLC) memory block within a specific NV memory element of the at least one NV memory element, rather than indirectly writes the received data into the specific block by first temporarily writing the received data into any other block configured to be Single Level Cell (SLC) memory block.

Besides providing the above method and memory apparatus, the present invention also provides a controller of a memory apparatus. The memory apparatus includes at least one non-volatile (NV) memory element, each of the at least one NV memory element includes a plurality of blocks. The controller includes a processing unit, arranged for managing the memory apparatus according to a program code embedded in the processing unit or received from outside of the processing unit, wherein the controller temporarily stores data received from a host device into a volatile memory in the controller and utilizing the data in the volatile memory as received data, and dynamically monitors the data amount of the received data to determine whether to immediately write the received data into the at least one NV memory element, wherein at least one write command received from the host device indicates that the host device requests to write the data. When determining to immediately write the received data into the at least one NV memory element, the controller directly writes the received data into a specific block configured to be a Multiple Level Cell (MLC) memory block within a specific NV memory element of the at least one NV memory element, rather than indirectly writes the received data into the specific block by first temporarily writing the received data into any other block configured to be Single Level Cell (SLC) memory block.

An advantage provided by the present invention is that, compared with related arts, the methods, memory apparatuses and controllers of the present invention may save the storage space occupied by the SLC memory block, so as to provide more MLC memory blocks.

Another advantage provided by the present invention is that, compared with related arts, the methods, memory apparatuses and controllers of the present invention may save the time of temporarily writing the received data into the SLC memory block and then collecting the data from the SLC memory block to the MLC memory blocks, and may save the time of frequently erasing the SLC memory blocks. Hence, compared with related arts, the present invention provides better performance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
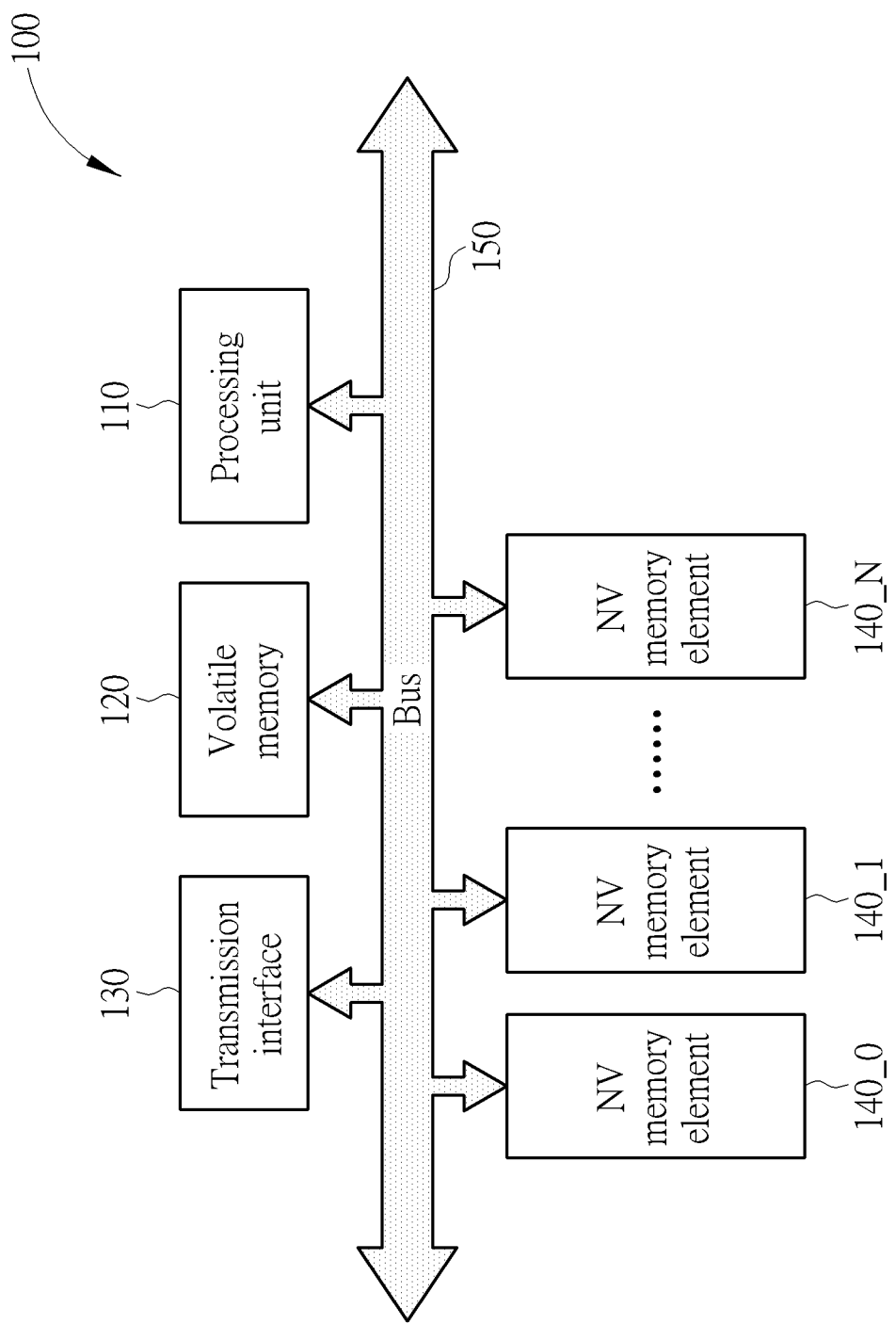
FIG. 1 is a diagram illustrating a memory apparatus according to a first embodiment of the present invention.

Please refer to FIG. 1, which is a diagram illustrating a memory apparatus 100 according to a first embodiment of the present invention. The memory apparatus 100 includes a processing unit 110, a volatile memory 120, a transmission interface 130, a plurality of non-volatile (NV) memory elements 140_1, 140_2, . . . , 140_N (the symbol N represents a positive integer), and a bus 150. In typical conditions, after the transmission interface 130 is coupled to a host device (not shown in FIG. 1), the host device can access the memory apparatus 100 through the transmission interface 130. For example, the host device may be a personal computer such as a laptop computer or a desktop computer.

The processing unit 110 may manage the memory apparatus 100 according to program codes embedded therein or received from outside of the processing unit 110. For example, the program code may be a hardware code embedded in the processing unit 110, and more particularly, a read-only memory code (ROM code). For another example, the program code may be a firmware code received from outside of the processing unit 110. Specifically, the processing unit 110 is used to control the volatile memory 120, the transmission interface 130, the NV memory element 140_1, 140_2, . . . , 140_N and the bus 150. The processing unit 110 in this embodiment may be an advanced reduced instruction set computer machine (Advanced RISC Machine, ARM) processor or an Argonaut RISC Core (ARC) processor. However, this is merely for illustrative purpose, not a limitation to the present invention. According to a modification of this embodiment, the processing unit 110 may be other type of processor.

Further, the volatile memory 120 can be used to store a global page address linking table, the data accessed by the host device, and other information required for accessing the memory apparatus 100. In this embodiment, the volatile memory 120 may be a dynamic random access memory (DRAM). However, this is merely for illustrative purpose, not a limitation to the present invention. According to a modification of this embodiment, the volatile memory 120 may be other type of volatile memory. For example, the volatile memory 120 may include a static random access memory (SRAM).

According to this embodiment, the transmission interface 130 shown in FIG. 1 is used to transmit commands between the host device and the memory apparatus 100, wherein the transmission interface 130 meets a specific communication specification such as the serial advanced technology attachment (SATA) specification, the parallel advanced technology attachment (PATA) specification or the universal serial bus (USB) specification. For example, the memory apparatus 100 is an SSD arranged in the host device, and the specific communication specification can be one of typical communication specifications for implementing inner communications in the host device, such as the SATA and PATA specifications. For another example, the memory apparatus 100 is an SSD arranged outside of the host device, and the specific communication specification can be used to implement some typical communication specifications performed outside of the host device, such as the USB specification. However, this is merely for illustrative purpose, not a limitation to the present invention. According to a modification of this embodiment, the memory apparatus 100 can be a portable memory apparatus such as a memory card, and the specific communication can be used to implement some typical communications of the input/output (I/O) interface of a memory card, such as the secure digital (SD) specification or the compact flash (CF) specification.

Moreover, the NV memory elements 140_1, 140_2, . . . , 140_N can be used to store data, wherein the NV memory elements 140_1, 140_2, . . . , 140$_N$ can be (but are not limited to) NAND flash chips. The bus 150 is used to couple the processing unit 110, the volatile memory 120, the transmission interface 130, and the NV memory elements 140_1, 140_2, ..., 140_N, and used for implementing communications between these elements. In this embodiment, all elements in the structure of FIG. 1, except the NV memory elements 140_1, 140_2, ..., 140_N, can be integrated as a controller, especially an integrated circuit (IC) such as a controller chip. The controller is used to control at least one NV memory element in the memory apparatus 100, such as the NV memory elements 140_1, 140_2, ..., 140_N, and can be viewed as the controller of the memory apparatus 100.

Figure 2:
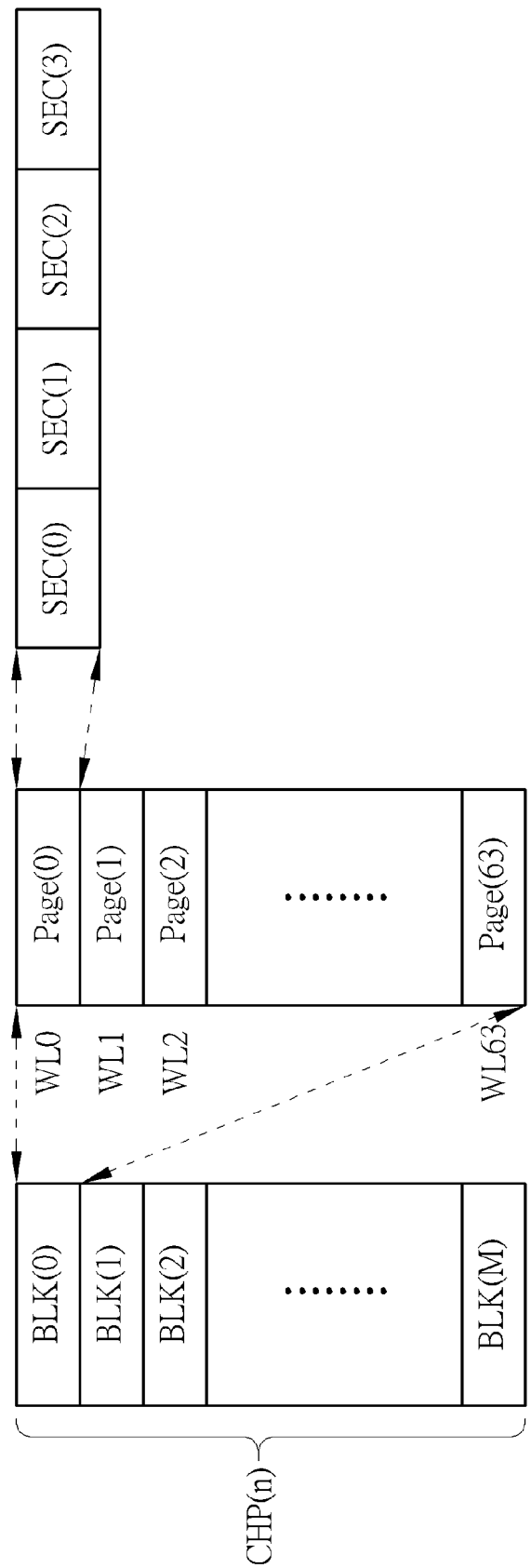
FIG. 2 depicts a content arrangement of one of the NV memory elements, wherein the NV memory element is a flash chip in this embodiment.

Please refer to FIG. 2, which depicts a content arrangement of an NV memory element 140_n of the NV memory elements 140_1, 140_2, ..., 140_N, wherein the NV memory element 140_n can be a flash chip CHP (n) in this embodiment, and the index n can represent any integer within the range [0, N]. As shown in FIG. 2, each NV memory element of the NV memory elements 140_1, 140_2, ..., 140_N, such as the flash chip DNP(n), may include a plurality of blocks such as the blocks BLK(0), BLK (1), BLK (2), ..., BLK (M) (the symbol M represents a positive integer), wherein each block includes a plurality of pages each including a plurality of sectors. In this embodiment, one sector can be a smallest read unit. In other words, during one read operation, the processing unit 110 may read a sector or a plurality of sectors. However, this is merely for illustrative purpose, not a limitation to the present invention.

As shown in FIG. 2, a block (e.g. the block BLK (0)) in the NV memory element 140_n such as the flash chip CHP(n) is configured as a single level cell (SLC) memory block, and the block such as the block BLK(0) may include a predetermined number of pages, such as the pages Page (0), Page (1), Page (2), ..., Page (63) respectively corresponding to the word-lines WL0, WL1, WL2, ..., WL63, wherein each page such as Page (0) may include a plurality of sectors SEC (0), SEC (1), SEC (2), ..., SEC (3). However, this is merely for illustrative purpose, not a limitation to the present invention. According to a modification of this embodiment such as the embodiment shown in FIG. 3, under the situation that a block (e.g. the block BLK (0)) in the NV memory element 140_n (e.g. the flash chip CHP(n)) is configured as a multiple level cell (MLC) memory block (e.g. a triple level cell (TLC) memory block), the block (e.g. the block BLK(0)) may include a predetermined number of pages, such as the sets of pages {Page (0), Page (1), Page (2)}, {Page (3), Page (4), Page (5)}, {Page (6), Page (7), Page (8)}, ..., {Page (189), Page (190), Page (191)}, wherein each page such as the page Page (0) may include sectors SEC (0), SEC (1), SEC (2) and SEC (3).

Figure 4:
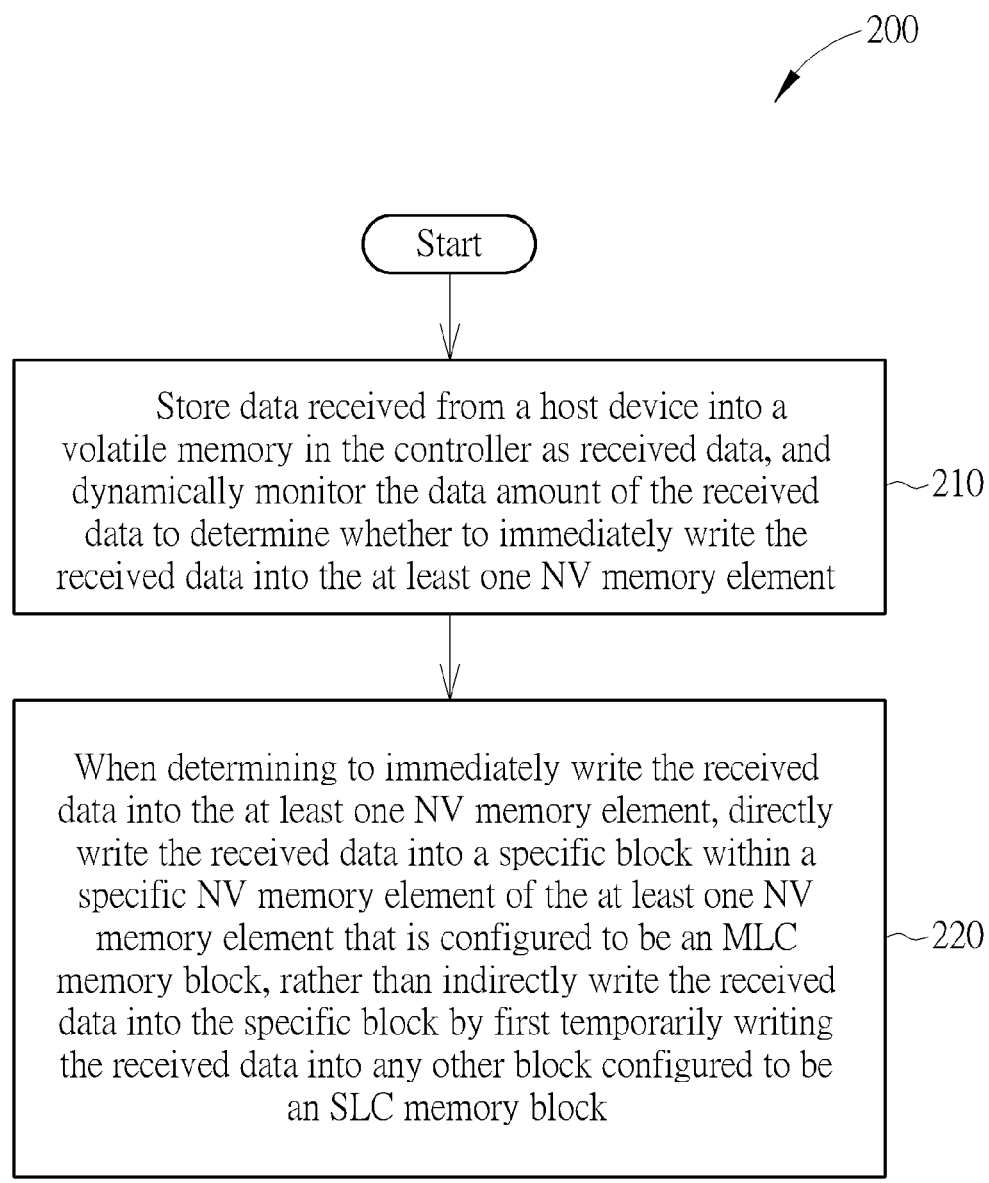
FIG. 4 is a flowchart illustrating a method for managing a memory apparatus according to an embodiment of the present invention.

Please refer to FIG. 4, which is a flowchart illustrating a method 200 for managing a memory apparatus according to an embodiment of the present invention. The method 200 can be applied to the memory apparatus 100 shown in FIG. 1, especially the aforementioned controller (e.g. the memory controller that executes the aforementioned program codes through the processing unit 110), wherein the controller that executes the aforementioned program codes is used to control the aforementioned at least one NV memory element such as the NV memory elements 140_1, 140_2, ..., 140_N shown in FIG. 1. The method is described as follows.

In step 210, the controller temporarily stores data received from a host device into a volatile memory 120 in the controller to utilize the data in the volatile memory 120 as received data, and dynamically monitors the data amount of the received data to determine whether to immediately write the received data into the at least one NV memory element, wherein at least one write command received from the host device indicates that the host device requests to write the data. Specifically, when the amount of the received data reaches a predetermined data amount threshold PDDR_TH, the controller determines to immediately write the received data into the at least one NV memory element.

Figure 3:
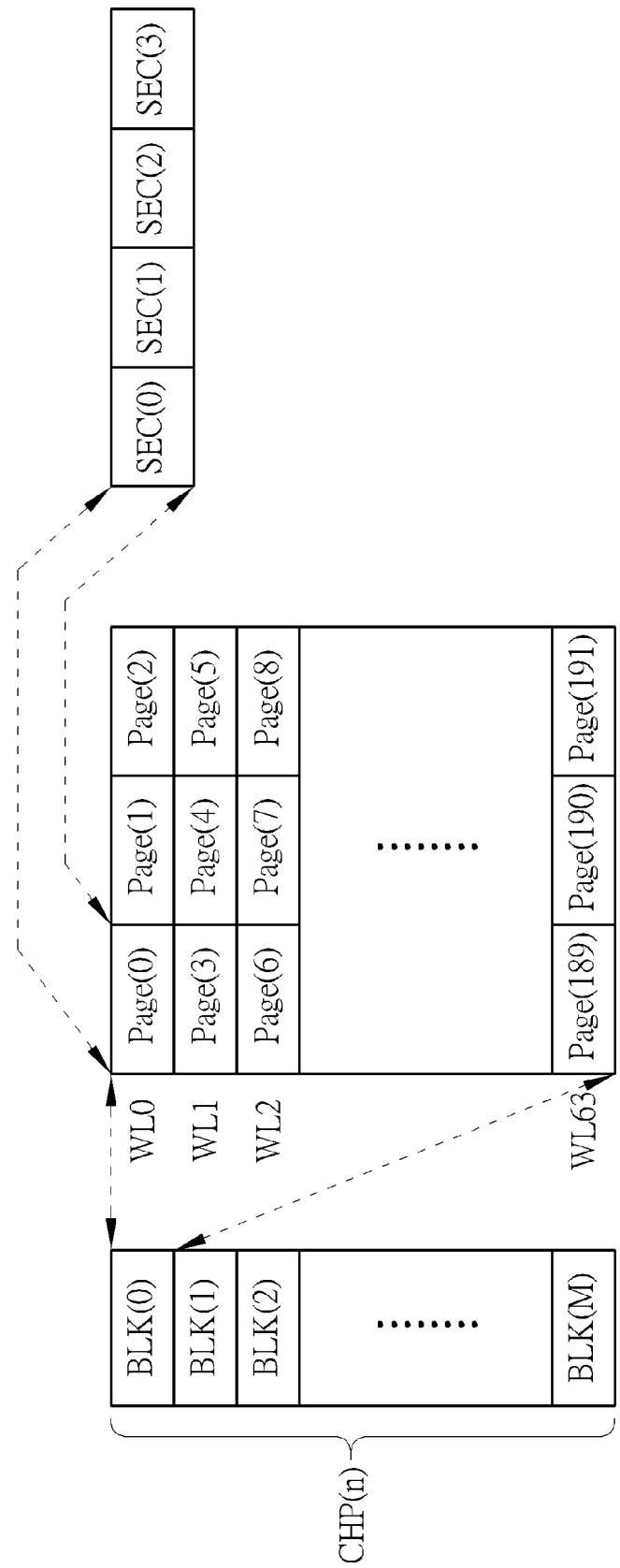
FIG. 3 depicts another content arrangement of one of the NV memory elements, wherein the NV memory element is a flash chip in this embodiment.

In step 220, when determining to immediately write the received data into the at least one NV memory element, the controller directly writes the received data into a specific block within a specific NV memory element of the at least one NV memory element that is configured to be an MLC memory block (e.g. the block having 192 pages Page (0), Page (1), ..., Page (191), as shown in FIG. 3), rather than indirectly writes the received data into the specific block by first temporarily writing the received data into any other block configured to be an SLC memory block (e.g. the block having 64 pages Page (0), Page (1), ..., Page (63), as shown in FIG. 2). For example, the NV memory element can be the flash chip CHP (n) shown in FIG. 3, wherein the specific block can be a block of the blocks {BLK (0), BLK (1), BLK (2), ..., BLK (M)} such as the block BLK(m), and the index m can represent any integer in the range [0, M].

According to this embodiment, under the situation that a memory cell in the specific block is used to store a plurality of bits, the plurality of bits are required to be repeatedly written into the memory cell for a predetermined number of times PDNT_WR, so as to make the memory cell in the specific NV memory element programmed correctly. In this way, each bit of the plurality of bits is correctly stored in the memory cell for further reading, wherein the predetermined number of times PDNT_WR is larger than 1. In practice, the storage capacity of the volatile memory 120 is larger than or equal to the product of the predetermined data amount threshold PDDA_TH and the predetermined number of times PDNT_WR (i.e., PDDA_TH*PDNT_WR), to allow at least a portion of the received data to be used in a repeated write operation of the memory cell. For example, regarding some types of MLC flash memories, the specific block is configured as a TLC memory block, the predetermined number of times PDNT_WR can be equal to 3, and the predetermined data amount threshold PDDA_TH can be equal to the storage capacity of a set of memory cells belonging to a word-line in the specific NV memory element. However, this is merely for illustrative purpose, not a limitation to the present invention.

Please note that, in this embodiment, the controller can directly write the received data into the specific block several times, to ensure that the user data is error-free. Specifically, under the control of the controller, the number of times the received data is written into the specific block would reach the predetermined number of times PDNT_WR, so that a specific set of memory cells belonging to a specific word-line in the specific block is correctly programmed in the NV memory element. In this way, each bit in the received data is correctly stored into the specific set of memory cells for further reading.

Further, under the situation that the host device wants to read the data from the aforementioned at least one NV memory element, the data is not yet written into any NV memory element in step 210. Hence, before determining to immediately write the received data into the aforementioned at least one NV memory element, when at least one read command received from the host device indicates that the host device requests to read at least a portion of the data, the controller can read at least the portion of the data from the volatile memory 120 to respond to the host device, instead of reading at least the portion of the data from the specific NV memory element.

According to a modification of this embodiment, the controller receives multiple sets of data {Data (0), Data (1), Data (2)}, { Data (3), Data (4), Data (5)}, {Data (6), Data (7), Data (8)}, . . . respectively, and temporally stores the sets of data {Data (0), Data (1), Data (2)}, {Data (3), Data (4), Data (5)}, {Data (6), Data (7), Data (8)}, . . . into the volatile memory 120, wherein each of the sets of data includes a plurality of pages, and the data amount of each of the sets of data is equal to the predetermined data amount threshold PDDA_TH. Specifically, the controller reads the sets of data {Data (0), Data (1), Data (2)}, {Data (3), Data (4), Data (5)}, {Data (6), Data (7), Data (8)} from the volatile memory 120, respectively, for directly writing the sets of data {Data (0), Data (1), Data (2)}, {Data (3), Data (4), Data (5)}, {Data (6), Data (7), Data (8)} into the specific block, respectively, and directly writes the first set of data {Data (0), Data (1), Data (2)} among the sets of data {Data (0), Data (1), Data (2)}, {Data (3), Data (4), Data (5)}, {Data (6), Data (7), Data (8)} into the specific block several times, wherein the number of times the first set of data {Data (0), Data (1), Data (2)} is written into the specific block would reach the predetermined number of times PDNT_WR, so that a specific set of memory cells belonging to a specific word-line in the specific block is correctly programmed in the specific NV memory element, thus making each bit of the first set of data {Data (0), Data (1), Data (2)} be correctly stored in the specific set of memory cells for further reading.

Figure 5:
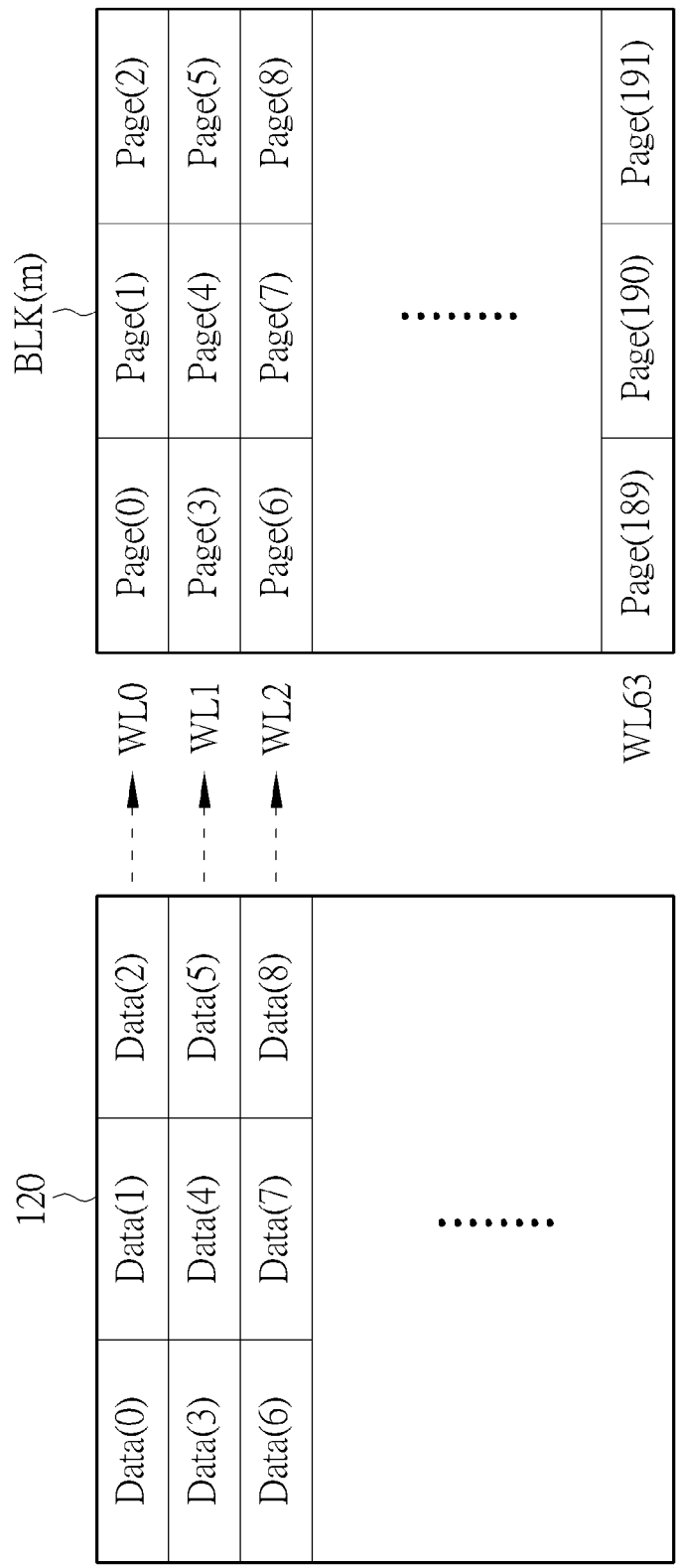
FIG. 5 depicts a control scheme involved by the method shown in FIG. 4 in an embodiment.
Figure 6:
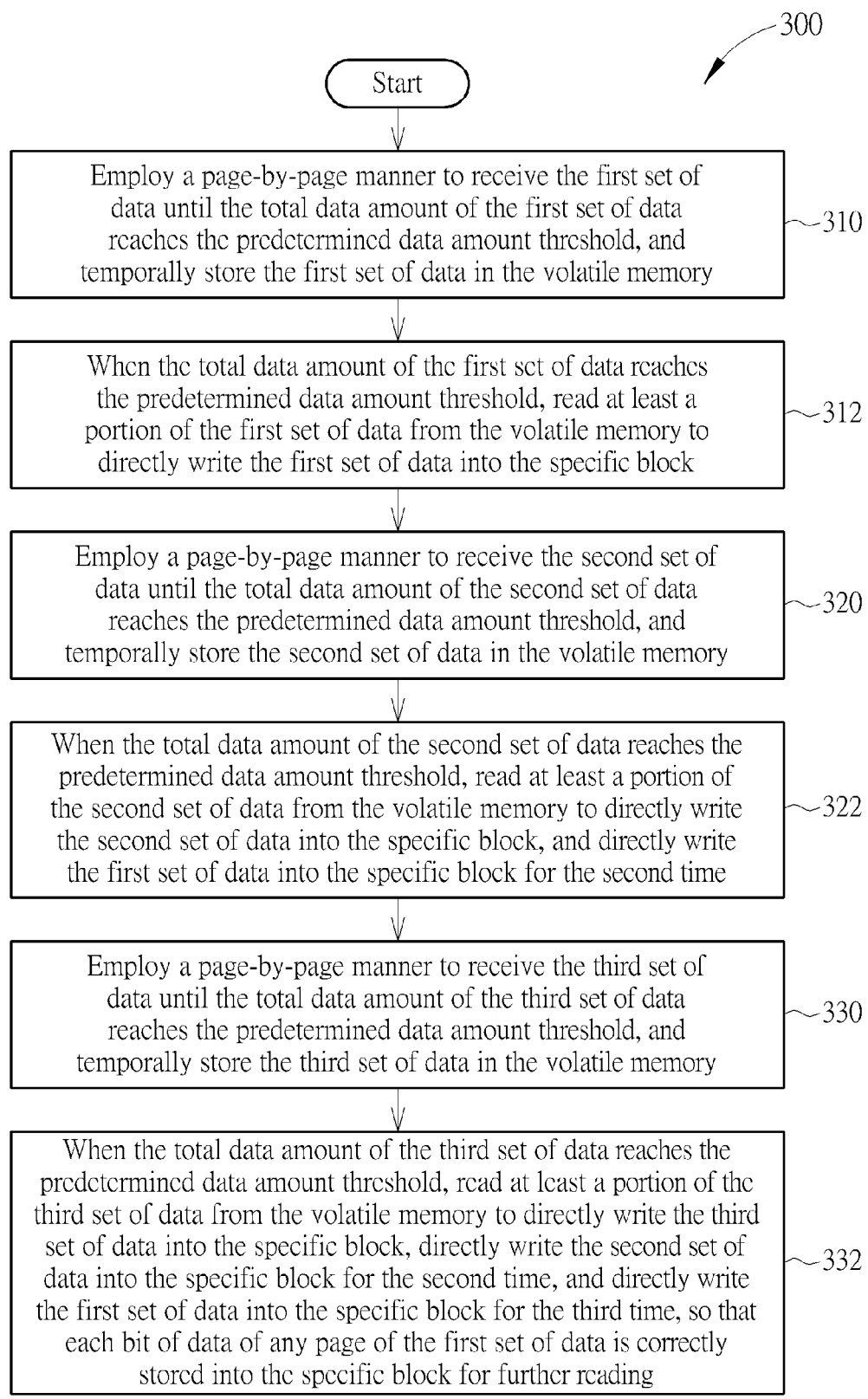
FIG. 6 is a flowchart illustrating the procedure of the control scheme shown in FIG. 5.

Please refer to FIGS. 5 and 6. FIG. 5 depicts a control scheme involved by the method 200 shown in FIG. 4 in an embodiment. FIG. 6 is a flowchart illustrating the procedure 300 of the control scheme shown in FIG. 5. In FIG. 5, each of the sets of data Data (0), Data (1), Data (2), Data (3), Data (4), Data (5), Data (6), Data (7), Data (8), . . . can be page data. For example, the size of page data can be 16 kilobytes (KB). However, this is merely for illustrative purpose, not a limitation to the present invention.

In step 310, the controller employs a page-by-page manner to receive the first set of data {Data (0), Data (1), Data (2)} until the total data amount of the first set of data {Data (0), Data (1), Data (2)} reaches the predetermined data amount threshold PDDA_TH, and temporally stores the first set of data {Data (0), Data (1), Data (2)} in the volatile memory 120, wherein before the total data amount of the first set of data {Data (0), Data (1), Data (2)} reaches the predetermined data amount threshold PDDA_TH, the first set of data {Data (0), Data (1), Data (2)} is not written into the specific block.

In step 312, when the total data amount of the first set of data {Data (0), Data (1), Data (2)} reaches the predetermined data amount threshold PDDR_TH, the controller reads at least a portion of the first set of data {Data (0), Data (1), Data (2)} from the volatile memory 120 to directly write the first set of data {Data (0), Data (1), Data (2)} into the specific block.

In step 320, the controller employs a page-by-page manner to receive the second set of data {Data (3), Data (4), Data (5)} until the total data amount of the second set of data {Data (3), Data (4), Data (5)} reaches the predetermined data amount threshold PDDA_TH, and temporally stores the second set of data {Data (3), Data (4), Data (5)} in the volatile memory 120, wherein before the total data amount of the second set of data {Data (3), Data (4), Data (5)} reaches the predetermined data amount threshold PDDR_TH, the second set of data {Data (3), Data (4), Data (5)} is not written into the specific block.

In step 322, when the total data amount of the second set of data {Data (3), Data (4), Data (5)} reaches the predetermined data amount threshold PDDR_TH, the controller reads at least a portion of the second set of data {Data (3), Data (4), Data (5)} from the volatile memory 120 to directly write the second set of data {Data (3), Data (4), Data (5)} into the specific block, and directly writes the first set of data {Data (0), Data (1), Data (2)} into the specific block for the second time.

In step 330, the controller employs a page-by-page manner to receive the third set of data {Data (6), Data (7), Data (8)} until the total data amount of the third set of data {Data (6), Data (7), Data (8)} reaches the predetermined data amount threshold PDDA_TH, and temporally stores the third set of data {Data (6), Data (7), Data (8)} in the volatile memory 120, wherein before the total data amount of the third set of data {Data (6), Data (7), Data (8)} reaches the predetermined data amount threshold PDDA_TH, the third set of data {Data (6), Data (7), Data (8)} is not written into the specific block.

In step 332, when the total data amount of the third set of data {Data (6), Data (7), Data (8)} reaches the predetermined data amount threshold PDDR_TH, the controller reads at least a portion of the third set of data {Data (6), Data (7), Data (8)} from the volatile memory 120 to directly write the third set of data {Data (6), Data (7), Data (8)} into the specific block, directly writes the second set of data {Data (3), Data (4), Data (5)} into the specific block for the second time, and directly writes the first set of data {Data (0), Data (1), Data (2)} into the specific block for the third time, so that each bit of data of any page of the first set of data {Data (0), Data (1), Data (2)} is correctly stored into the specific block for further reading. For example, if the predetermined number of times PDNT_WR is equal to 3, the write operation of the first set of data {Data (0), Data (1), Data (2)} is completed.

Similarly, regarding the sets of data following the sets of data Data (0), Data (1), Data (2), Data (3), Data (4), Data (5), Data (6), Data (7), and Data (8), the controller can process them according to the procedure 300 shown in FIG. 6, especially steps 330 and 332. For example, when the total data amount of a fourth set of data {Data (9), Data (10), Data (11)} in the sets of data Data (0), Data (1), Data (2), Data (3), Data (4), Data (5), Data (6), Data (7), Data (8), . . . reaches the predetermined data amount threshold PDDRC_TH, the controller reads at least a portion of the fourth set of data {Data (9), Data (10), Data (11)} from the volatile memory 120 to directly write the fourth set of data {Data (9), Data (10), Data (11)} into the specific block, directly writes the third set of data{Data (6), Data (7), Data (8)} into the specific block for the second time, and directly writes the second set of data {Data (3), Data (4), Data (5)} into the specific block for the third time, so that each bit of data of any page of the second set of data {Data (3), Data (4), Data (5)} is correctly stored into the specific block for further reading. For example, if the predetermined number of times PDNT_WR is equal to 3, the write operation of the second set of data {Data (3), Data (4), Data (5)} is completed. Therefore, by utilizing the procedure 300 shown in FIG. 6, all data in the sets of data Data (0), Data (1), Data (2), Data (3), Data (4), Data (5), Data (6), Data (7), Data (8), . . . can be correctly stored into the specific block for further reading. The similar parts between the present and previous embodiments/modifications are omitted here for brevity.

Figure 7:
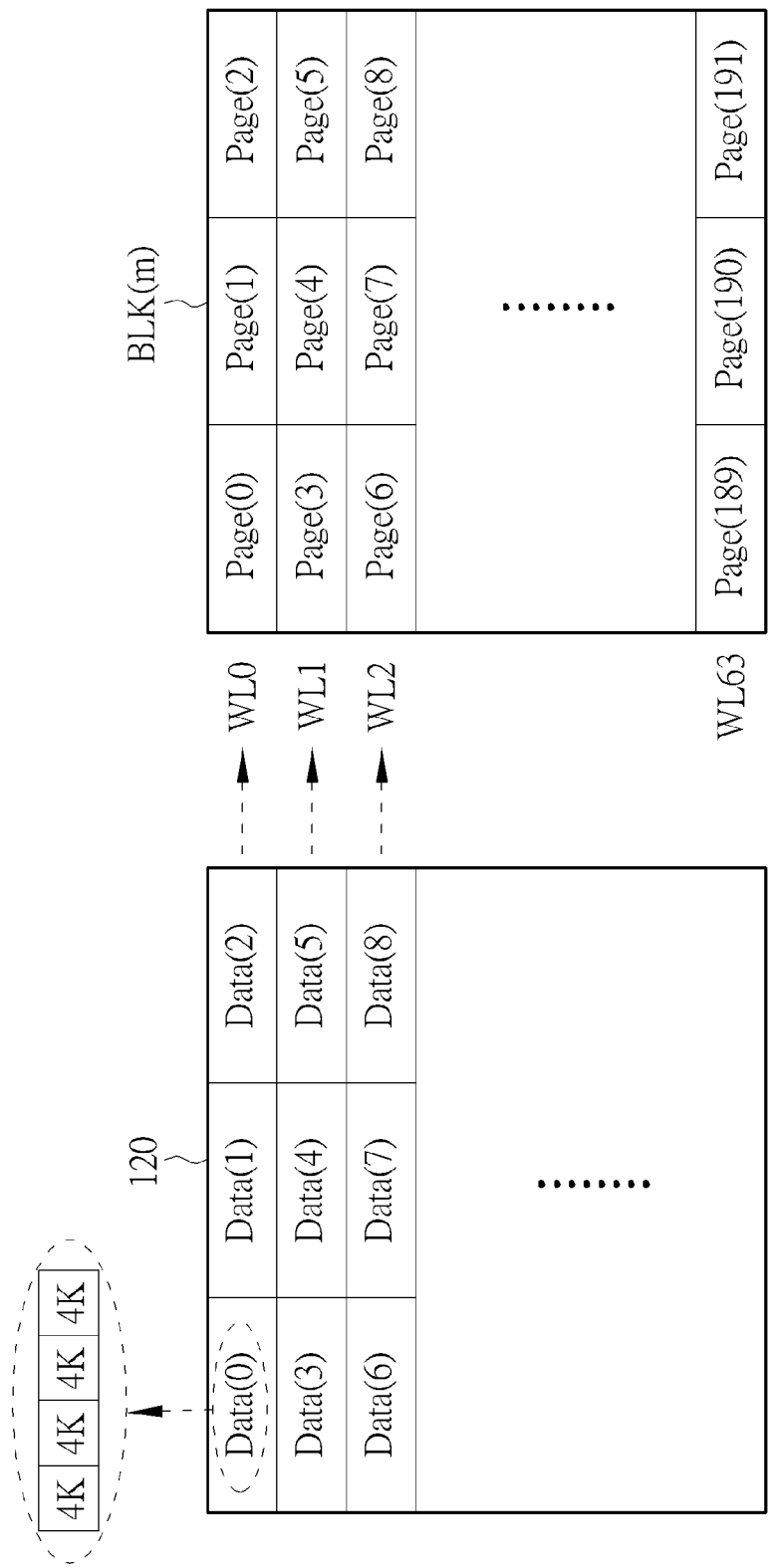
FIG. 7 depicts another control scheme involved by the method shown in FIG. 4 in an embodiment.

Please refer to FIG. 7, which depicts another control scheme involved by the method 200 shown in FIG. 4 in an embodiment, wherein each data of the sets of data Data (0), Data (1), Data (2), Data (3), Data (4), Data (5), Data (6), Data (7), Data (8), . . . can be 16 KB data, and can be divided into four 4 KB sub-data (in FIG. 7, "4K" denotes the size of 4 KB). This embodiment can be applied to the write operation of data at random logical addresses. However, this is merely for illustrative purpose, not a limitation to the present invention.

According to this embodiment, the controller can utilize the volatile memory 120 to collect data at random logical addresses, wherein the size of one data for performing the random write operation can be 4 KB. When the size of the collected data reaches 16 KB, the controller treats the collected 16 KB data as one page data in the embodiment of FIG. 5 (e.g. data Data (0) or any of data Data (1), Data (2), Data (3), Data (4), Data (5), Data (6), Data (7), Data (8), . . .), and processes the collected 16 KB data in the same way mentioned above. The similar parts between the present and previous embodiments/modifications are omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for managing a memory apparatus, the memory apparatus comprising at least one non-volatile (NV) memory element, each of the at least one NV memory element comprising a plurality of blocks, the method applied to a controller of the memory apparatus, the controller being used to control the at least one NV element, the method comprising following steps:
   temporarily storing data received from a host device into a volatile memory in the controller and utilizing the data in the volatile memory as received data, and dynamically monitoring a data amount of the received data to determine whether to immediately write the received data into the at least one NV memory element, wherein at least one write command received from the host device indicates that the host device requests to write the data; and
   when determining to immediately write the received data into the at least one NV memory element, directly writing the received data into a specific block configured to be a Multiple Level Cell (MLC) memory block within a specific NV memory element of the at least one NV memory element, rather than indirectly writing the received data into the specific block by first temporarily writing the received data into any other block configured to be a Single Level Cell (SLC) memory block.

2. The method of claim 1, wherein under a situation that a memory cell in the specific block is used to store a plurality of bits, the plurality of bits need to be repeatedly written into the memory cell for a predetermined number of times, so that the memory cell is correctly programmed in the specific NV memory element, thus making each of the plurality of bits correctly stored into the memory cell for further reading; and the predetermined number of times is larger than 1.

3. The method of claim 2, wherein the step of dynamically monitoring the data amount of the received data comprises:
   when the data amount of the received data reaches a predetermined data amount threshold, determining to immediately write the received data into the at least one NV memory element;
   wherein a storage capacity of the volatile memory is larger than or equal to a product of the predetermined data amount threshold and the predetermined number of times, to allow at least a portion of the received data to be used in a repeated write operation of the memory cell.

4. The method of claim 3, wherein the predetermined data amount threshold is equal to a storage capacity of a set of memory cells belonging to a word-line in the specific NV memory element.

5. The method of claim 4, wherein any of the plurality of blocks comprises a predetermined number of pages; and the method further comprises:
   receiving a plurality of sets of data from the host device, respectively, and temporarily storing the plurality of sets of data into the volatile memory, wherein each of the plurality of sets of data comprises a plurality of pages, and a data amount of each of the plurality of sets of data is equal to the predetermined data amount threshold; and
   reading the plurality of sets of data from the volatile memory, to directly write the plurality of sets of data into the specific block, respectively, and directly writing a first set of data of the plurality of sets of data into the specific block several times, wherein a number of times the first set of data is written into the specific block reaches the predetermined number of times, so that a specific set of memory cells belonging to a specific word-line in the specific block is correctly programmed in the specific NV memory element, thus making each bit of the first set of data correctly stored in the specific set of memory cells for further reading.

6. The method of claim 2, wherein any of the plurality of blocks comprises a predetermined number of pages; and the method further comprises:
   respectively receiving a first set of data comprising a plurality of pages from the host device in a page-by-page manner until a total received data amount of the first set of data reaches a predetermined data amount threshold, and temporarily storing the first set of data into the volatile memory, wherein before the total received data amount of the first set of data reaches the predetermined data amount threshold, the first set of data is not written into the specific block; and
   when the total received data amount of the first set of data reaches the predetermined data amount threshold, reading at least a portion of the first set of data from the volatile memory to directly write the first set of data into the specific block.

7. The method of claim 6, further comprising:
   respectively receiving a second set of data comprising a plurality of pages from the host device in a page-by-page manner until a total received data amount of the second set of data reaches the predetermined data amount threshold, and temporally storing the second set of data into the volatile memory, wherein before the total received data amount of the second set of data reaches the predetermined data amount threshold, the second set of data is not written into the specific block; and
   when the total received data amount of the second set of data reaches the predetermined data amount threshold, reading at least a portion of the second set of data from the volatile memory to directly write the second set of data into the specific block, and directly writing the first set of data into the specific block for a second time.

8. The method of claim 7, further comprising:
respectively receiving a third set of data comprising a plurality of pages from the host device in a page-by-page manner until a total received data amount of the third set of data reaches the predetermined data amount threshold, and temporally storing the third set of data into the volatile memory, wherein before the total received data amount of the third set of data reaches the predetermined data amount threshold, the third set of data is not written into the specific block; and when the total received data amount of the third set of data reaches the predetermined data amount threshold, reading at least a portion of the third set of data from the volatile memory to directly write the third set of data into the specific block, directly writing the second set of data into the specific block for a second time, and directly writing the first set of data into the specific block for a third time, so that each bit of data of any page of the first set of data is correctly stored into the specific block for further reading.

9. The method of claim 1, further comprising:
before determining to immediately write the received data into the at least one NV memory element:
when at least one read command received from the host device indicates that the host device requests to read at least a portion of the data, reading at least the portion of the data from the volatile memory to respond to the host device, instead of reading at least the portion of the data from the specific NV memory element.

10. The method of claim 1, further comprising:
directly writing the received data into the specific block several times, wherein under control of the controller, a number of times the received data is written into the specific block reaches a predetermined number of times, so that a specific set of memory cells belonging to a specific word-line in the specific block is correctly programmed in the NV memory element, thus making each bit in the received data correctly stored into the specific set of memory cells for further reading.

11. A memory apparatus, comprising:
at least one non-volatile (NV) memory element, each comprising
a plurality of blocks; and
a controller, arranged to control the at least one NV element, the controller comprising a processing unit arranged to manage the memory apparatus according to a program code embedded in the processing unit or received from outside of the processing unit, wherein the controller temporarily stores data received from a host device into a volatile memory in the controller and utilizes the data in the volatile memory as received data, and dynamically monitors a data amount of the received data to determine whether to immediately write the received data into the at least one NV memory element, wherein at least one write command received from the host device indicates that the host device requests to write the data;
wherein when determining to immediately write the received data into the at least one NV memory element, the controller directly writes the received data into a specific block configured to be a Multiple Level Cell (MLC) memory block within a specific NV memory element of the at least one NV memory element, rather than indirectly writes the received data into the specific block by first temporarily writing the received data into any other block configured to be a Single Level Cell (SLC) memory block.

12. The memory apparatus of claim 11, wherein under a situation that a memory cell in the specific block is used to store a plurality of bits, the plurality of bits need to be repeatedly written into the memory cell for a predetermined number of times, so that the memory cell is correctly programmed in the specific NV memory element, thus making each of the plurality of bits correctly stored into the memory cell for further reading; and the predetermined number of times is larger than 1.

13. The memory apparatus of claim 12, wherein when the data amount of the received data reaches a predetermined data amount threshold, the controller determines to immediately write the received data into the at least one NV memory element; and a storage capacity of the volatile memory is not less than a product of the predetermined data amount threshold and the predetermined number of times to allow at least a portion of the received data to be used in a repeated write operation of the memory cell.

14. The memory apparatus of claim 13, wherein the predetermined data amount threshold is equal to a storage capacity of a set of memory cells belonging to a word-line in the specific NV memory element.

15. The memory apparatus of claim 14, wherein any of the plurality of blocks comprises a predetermined number of pages; the controller receives a plurality of sets of data from the host device, respectively, and temporarily stores the plurality of sets of data into the volatile memory, wherein each of the plurality of sets of data comprises a plurality of pages, and a data amount of each of the plurality of sets of data is equal to the predetermined data amount threshold; and the controller reads the plurality of sets of data from the volatile memory to directly write the plurality of sets of data into the specific block, respectively, and directly writes a first set of data of the plurality of sets of data into the specific block several times, wherein a number of times the first set of data is written into the specific block reaches the predetermined number of times, so that a specific set of memory cells belonging to a specific word-line in the specific block is correctly programmed in the specific NV memory element, thus making each bit of the first set of data correctly stored in the specific set of memory cells for further reading.

16. A controller of a memory apparatus, the memory apparatus comprising at least one non-volatile (NV) memory element each comprising a plurality of blocks, the controller comprising:
a processing unit, arranged to manage the memory apparatus according to a program code embedded in the processing unit or received from outside of the processing unit, wherein the controller temporarily stores data received from a host device into a volatile memory in the controller and utilizes the data in the volatile memory as received data, and dynamically monitors a data amount of the received data to determine whether to immediately write the received data into the at least one NV memory element, wherein at least one write command received from the host device indicates that the host device requests to write the data; and
wherein when determining to immediately write the received data into the at least one NV memory element, the controller directly writes the received data into a specific block configured to be a Multiple Level Cell (MLC) memory block within a specific NV memory element of the at least one NV memory element, rather than indirectly writes the received data into the specific block by first temporarily writing the received data into any other block configured to be a Single Level Cell (SLC) memory block.

17. The controller of claim 16, wherein under a situation that a memory cell in the specific block is used to store a plurality of bits, the plurality of bits need to be repeatedly written into the memory cell for a predetermined number of times, so that the memory cell is correctly programmed in the specific NV memory element, thus making each of the plurality of bits correctly stored into the memory cell for further reading; and the predetermined number of times is larger than 1.

18. The controller of claim 17, wherein when the data amount of the received data reaches a predetermined data amount threshold, the controller determines to immediately write the received data into the at least one NV memory element; and a storage capacity of the volatile memory is larger than or equal to a product of the predetermined data amount threshold and the predetermined number of times to allow at least a portion of the received data to be used in a repeated write operation of the memory cell.

19. The controller of claim 18, wherein the predetermined data amount threshold is equal to a capacity of a set of memory cells belonging to a word-line in the specific NV memory element.

20. The controller of claim 19, wherein any of the plurality of blocks comprises a predetermined number of pages; the controller receives a plurality of sets of data from the host device, respectively, and temporarily stores the plurality of sets of data into the volatile memory, wherein each of the plurality of sets of data comprises a plurality of pages, and a data amount of each of the plurality of sets of data is equal to the predetermined data amount threshold; and the controller reads the plurality of sets of data from the volatile memory to directly write the plurality of sets of data into the specific block, respectively, and directly writes a first set of data of the plurality of sets of data into the specific block several times, wherein a number of times the first set of data is written into the specific block reaches the predetermined number of times, so that a specific set of memory cells belonging to a specific word-line in the specific block is correctly programmed in the specific NV memory element, thus making each bit of the first set of data correctly stored in the specific set of memory cell for further reading.

* * * * *